United States Patent
Asakawa et al.

(10) Patent No.: US 12,040,198 B2
(45) Date of Patent: Jul. 16, 2024

(54) INNER WALL AND SUBSTRATE PROCESSING APPARATUS

(71) Applicant: TOKYO ELECTRON LIMITED, Tokyo (JP)

(72) Inventors: Yuji Asakawa, Nirasaki (JP); Atsushi Tanaka, Nirasaki (JP); Hiroyuki Ogawa, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 142 days.

(21) Appl. No.: 16/641,456

(22) PCT Filed: Aug. 13, 2018

(86) PCT No.: PCT/JP2018/030184
§ 371 (c)(1),
(2) Date: Feb. 24, 2020

(87) PCT Pub. No.: WO2019/039337
PCT Pub. Date: Feb. 28, 2019

(65) Prior Publication Data
US 2020/0203194 A1    Jun. 25, 2020

(30) Foreign Application Priority Data
Aug. 25, 2017    (JP) .................................. 2017-162755

(51) Int. Cl.
*H01L 21/67* (2006.01)
(52) U.S. Cl.
CPC .............................. *H01L 21/67063* (2013.01)

(58) Field of Classification Search
None
See application file for complete search history.

(56) References Cited

U.S. PATENT DOCUMENTS

| | | | | |
|---|---|---|---|---|
| 5,695,564 A | * | 12/1997 | Imahashi | H01L 21/67161 414/217 |
| 2006/0037702 A1 | * | 2/2006 | Hayashi | H01J 37/32449 156/345.46 |
| 2010/0243608 A1 | * | 9/2010 | Koshimizu | H01J 37/32541 134/1.1 |
| 2015/0041061 A1 | * | 2/2015 | Shoji | H01J 37/32834 138/40 |
| 2016/0027672 A1 | * | 1/2016 | Asakawa | H01L 21/68742 156/345.37 |
| 2016/0189987 A1 | * | 6/2016 | Amikura | H01J 37/32449 156/345.29 |

FOREIGN PATENT DOCUMENTS

| | | |
|---|---|---|
| JP | 2007-214513 A | 8/2007 |
| KR | 10-2016-0079688 A | 7/2016 |

* cited by examiner

*Primary Examiner* — Keath T Chen
*Assistant Examiner* — Margaret Klunk
(74) *Attorney, Agent, or Firm* — Nath, Goldberg & Meyer; Jerald L. Meyer; Tanya E. Harkins

(57) ABSTRACT

A cylindrical inner wall used in a substrate processing apparatus and surrounding a stage on which a substrate is placed, with a gap between the inner wall and an outer periphery of the stage. The inner wall includes a plurality of slits formed in a lower end of the inner wall, and a plurality of grooves formed in the inner surface of the inner wall to extend from an upper end to the lower end of the inner wall so as to communicate with the slits.

6 Claims, 11 Drawing Sheets

INNER WALL AND SUBSTRATE PROCESSING APPARATUS

CROSS-REFERENCE OF RELATED APPLICATION

This is a National Phase Application filed under 35 U.S.C. 371 as a national stage of PCT/JP2018/030184, filed Aug. 13, 2018, an application claiming the benefit of Japanese Patent Application No. 2017-162755, filed on Aug. 25, 2017, in Japan Patent Office, the disclosure of each of which is incorporated herein in its entirely by reference.

TECHNICAL FIELD

The present disclosure relates to a cylindrical inner wall, which is used when performing a predetermined processing on a substrate and surrounds a stage on which the substrate is placed, and a substrate processing apparatus including the inner wall.

BACKGROUND

In recent years, with the miniaturization of semiconductor devices, in place of conventional etching techniques such as dry etching and wet etching, a technique called chemical oxide removal (COR) process that enables finer etching has been used.

The COR process is a process of supplying processing gases to, for example, a semiconductor wafer (hereinafter, referred to as "wafer") as a workpiece inside a processing container kept at a vacuum, and allowing the processing gases to react with, for example, a film formed on the wafer so as to produce a product. The product produced on a front surface of the wafer by the COR process is sublimated by performing heat treatment in a next step, whereby the film on the front surface of the wafer is removed.

Such COR process is performed by a single-wafer-type processing apparatus that processes wafers one by one. However, in recent years, there is a case in which a processing apparatus that simultaneously processes a plurality of wafers is used to improve throughput (Patent Document 1).

In the processing apparatus disclosed in Patent Document 1, it has been proposed to provide a baffle plate that partitions the interior of a processing container into a processing space and an exhaust space in order to prevent the flow of a processing gas from becoming uneven on the front surfaces of the plurality of (for example, two) wafers.

PRIOR ART DOCUMENTS

Patent Documents

Patent Document 1: Japanese Laid-Open Patent Publication No. 2007-214513

SUMMARY

However, in recent years, the demand for uniformity of wafer processing has become stricter. In a processing apparatus that simultaneously processes two wafers as described above, it is difficult to appropriately control the flow of a processing gas, and thus it is difficult to ensure the uniformity of the processing gas on a front surface of each wafer.

The present disclosure provides a technique for performing a substrate process with in-plane uniformity using a predetermined processing gas.

According to an aspect of the present disclosure, there is provided a cylindrical inner wall that surrounds a stage on which a substrate is placed, with a gap between the inner wall and an outer periphery of the stage. The inner wall includes a plurality of slits formed at a lower end of the inner wall, and a plurality of grooves formed in an inner surface of the inner wall to extend from an upper end to a lower end of the inner surface so as to communicate with the respective slits.

The inner wall according to an embodiment of the present disclosure is used when discharging a processing gas used for the substrate process. That is, a processing gas is supplied to the substrate placed on the stage to perform a predetermined process, and thereafter, the processing gas used for the process is discharged from the outer periphery of the substrate through an exhaust space between the outer periphery of the stage and the inner wall. In order to uniformly perform the substrate process, the processing gas needs to remain uniformly on a front surface of the substrate, and the processing gas needs to be discharged uniformly from the outer periphery of the substrate. In this regard, since the grooves are formed in the inner surface of the inner wall according to the present disclosure to extend from the upper end to the lower end of the inner surface, the processing gas is rectified by the grooves and discharged from the slits. Accordingly, by using the inner wall of the present disclosure, it is possible to uniformly discharge the processing gas, and to cause the processing gas to uniformly remain on the front surface of the substrate. As a result, it is possible to make a substrate processing rate uniform, and to perform the substrate process with in-plane uniformity.

According to another aspect of the present disclosure, there is provided a substrate processing apparatus for processing a substrate, including: a processing container in which a substrate is accommodated; a stage configured to place the substrate thereon inside the processing container; a gas supply part configured to supply a processing gas from above the stage toward the stage; an exhaust part configured to exhaust an interior of the processing container; a partition wall disposed inside the processing container and surrounding the stage with a gap between the partition wall and an outer periphery of the stage; a lifting mechanism configured to move upward and downward the partition wall between a retraction position and a substrate processing position; and an inner wall disposed on a bottom surface of the processing container and surrounding the stage with a gap between the inner wall and an outer periphery of the stage. A plurality of slits are formed at a lower end of the inner wall, a plurality of grooves are formed in an inner surface of the inner wall and extending from an upper end to the lower end of the inner surface so as to communicate with the plurality of slits. A substrate processing space is formed by the partition wall and the inner wall by moving the partition wall to the substrate processing position, and the interior of the processing space is exhausted by the exhaust part through the plurality of grooves and the plurality of slits.

According to the present disclosure in some embodiments, it is possible to uniformly discharge a processing gas using an inner wall, and to perform a substrate process with in-plane uniformity.

DETAILED DESCRIPTION

Figure 1:
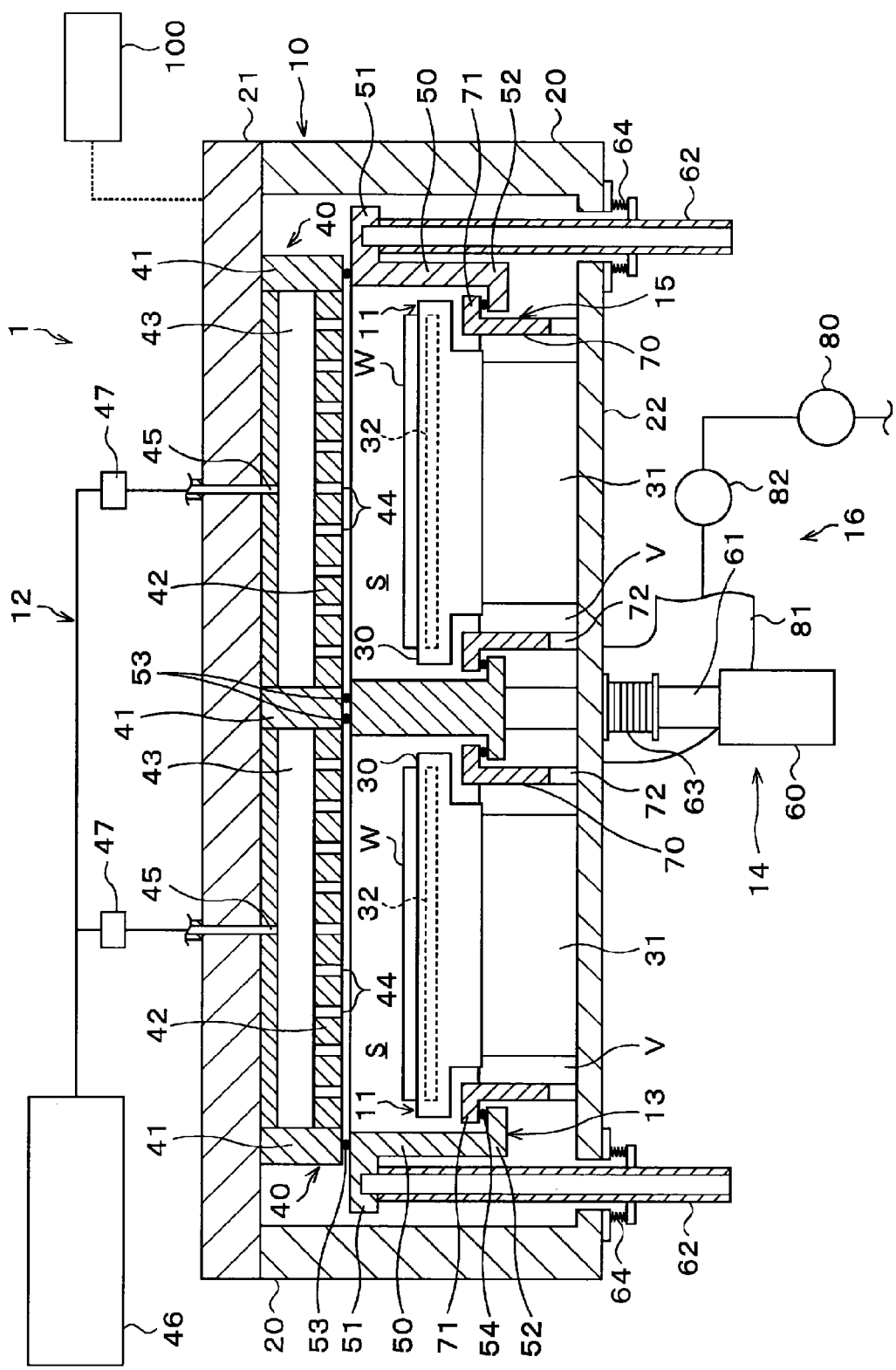
FIG. 1 is a vertical cross-sectional view schematically illustrating a configuration (configuration at a wafer processing position) of a wafer processing apparatus according to an embodiment.

Hereinafter, embodiments of the present disclosure will be described with reference to the drawings. In this specification and drawings, elements having substantially the same functional configurations will be denoted by the same reference numerals and redundant explanations thereof will be omitted.

First, a configuration of a wafer processing apparatus as a substrate processing apparatus according to the present embodiment will be described. FIG. 1 is a vertical cross-sectional view schematically illustrating the configuration of a wafer processing apparatus 1 according to the present embodiment. In the present embodiment, a case in which the wafer processing apparatus 1 is, for example, a COR processing apparatus that performs a COR process on a wafer W will be described.

As illustrated in FIG. 1, the wafer processing apparatus 1 includes an airtight processing container 10, a plurality of stages (two stages 11 and 11, in the present embodiment) configured to place wafers W thereon inside the processing container 10, a gas supply part 12 configured to supply a processing gas from above the stages 11 toward the stages 11, a vertically-movable partition wall 13 surrounding each of the stages 11 and 11, a lifting mechanism 14 fixed to a bottom surface of the processing container 10 and configured to move upward and downward the partition wall 13, inner walls 15 and 15 respectively surrounding the stages 11 and 11, and an exhaust part 16 configured to exhaust the interior of the processing container 10.

The processing container 10 is, for example, a substantially rectangular parallelepiped container as a whole, which is formed of a metal such as aluminum or stainless steel. The processing container 10 has, for example, a substantially rectangular shape in a plan view, and includes a cylindrical sidewall 20 having opened top and bottom surfaces, a ceiling plate 21 that hermetically covers the top surface of the sidewall 20, and a bottom plate 22 that covers the bottom surface of the sidewall 20. A seal member (not illustrated) is provided between an upper end surface of the sidewall 20 and the ceiling plate 21 so as to hermetically seal the interior of the processing container 10. The processing container 10 is provided with a heater (not illustrated). The bottom plate 22 is provided with a heat insulating material (not illustrated).

Each of the stages 11 is formed in a substantially cylindrical shape, and has an upper stage 30 having a placement surface on which the wafer W is placed, and a lower stage 31 fixed to the bottom plate 22 and supporting the upper stage 30. Each upper stage 30 includes a temperature adjustment mechanism 32 embedded therein so as to adjust a temperature of the wafer W. The temperature adjustment mechanism 32 adjusts the temperature of the stage 11 by circulating a coolant such as water, so that the temperature of the wafer W on the stage 11 is controlled to a predetermined temperature of, for example, −20 degrees C. to 140 degrees C.

In addition, a support pin unit (not illustrated) is provided at a position below the stage 11 on the bottom plate 22, and is configured such that the wafer W is capable of being delivered between a transfer mechanism (not illustrated) provided outside the wafer processing apparatus 1 and the support pin unit.

The gas supply unit 12 includes shower heads 40 configured to supply the processing gas to the wafers W placed on the stages 11. The shower heads 40 are provided individually on the lower surface of the ceiling plate 21 of the processing container 10 so as to face the stages 11 and 11, respectively. For example, each shower head 40 has a substantially cylindrical frame body 41 having an opened bottom surface and supported on the bottom surface of the ceiling plate 21, and a substantially disk-shaped shower plate 42, which is fitted to an inner surface of the frame body 41. The shower plate 42 is provided at a predetermined distance from a ceiling portion of the frame body 41. Thus, a space 43 is formed between the ceiling portion of the frame body 41 and an upper surface of the shower plate 42. The shower plate 42 has a plurality of openings 44 formed to penetrate the shower plate 42 in the thickness direction.

A gas source 46 is connected to the spaces 43 between the ceiling portion of the frame body 41 and the shower plate 42 via respective gas supply pipes 45. The gas source 46 is configured to supply, for example, a hydrogen fluoride (HF) gas or an ammonia ($NH_3$) gas as the processing gas. Therefore, the processing gas supplied from the gas source 46 is supplied toward the wafer W placed on each stage 11 via the space 43 and the shower plate 42. In addition, each gas supply pipe 45 is provided with a flow rate adjusting mechanism 47 that adjusts a supply amount of the processing gas. Thus, the gas supply pipes 45 are configured to be capable of individually controlling the amount of the processing gas to be supplied to the respective wafers W. In addition, the shower heads 40 may be a post-mix type shower head configured to be capable of individually supplying plural types of processing gases without mixing the processing gases with each other.

Figure 2:
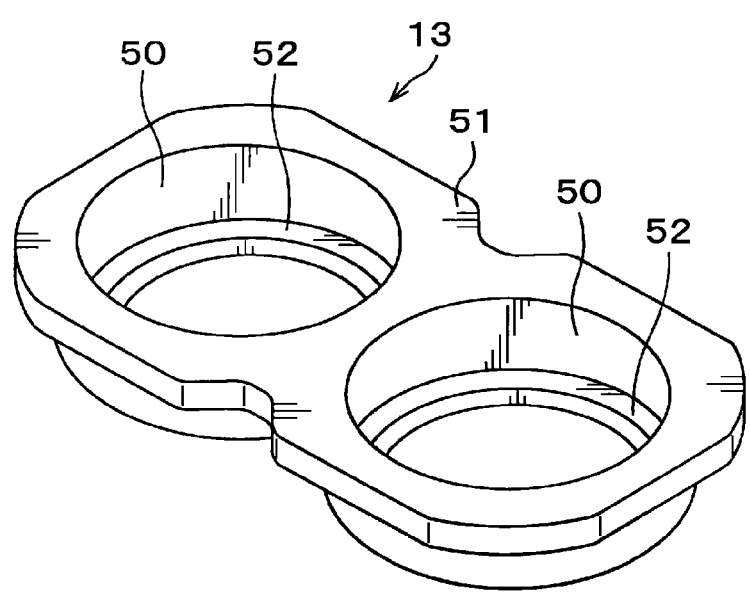
FIG. 2 is a perspective view schematically illustrating a configuration of a partition wall.

As illustrated in FIGS. 1 and 2, the partition wall 13 includes two cylindrical portions 50 and 50 that individually surround the two stages 11 and 11, and an upper flange portion 51 provided at upper ends of the cylindrical portions 50 and 50, and lower flange portions 52 and 52 provided at lower ends of the cylindrical portions 50 and 50. An inner diameter of each cylindrical portion 50 is set to be larger than an outer diameter of the stage 11. A gap is formed between the cylindrical portion 50 and the stage 11.

In addition, the partition wall 13 is provided with a heater (not illustrated), and is heated to, for example, 100 degrees C. to 150 degrees C. Due to this heating, foreign matter contained in the processing gas is prevented from adhering to the partition wall 13.

As illustrated in FIG. 1, seal members 53 such as, for example, O-rings, are provided on an upper surface of the upper flange portion 51 in a correspondence relationship with the respective stages 11. The seal members 53 hermetically block gaps between the upper flange portion 51 and the frame body 41 when the upper flange portion 51 and the frame body 41 are brought into contact with each other with the upward movement of the partition wall 13 by the lifting mechanism 14. In addition, seal members 54 such as, for example, O-rings, are also provided on protruded portions 71 (to be described later) of the inner walls 15 in a correspondence relationship with the respective stages 11. The seal members 54 hermetically block gaps between the protruded portions 71 and the lower flange portions 52 when the protruded portions 71 and the lower flange portions 52 are brought into contact with each other. Then, the partition wall 13 is moved upward such that the frame body 41 and the seal members 53 are brought into contact with each other and the lower flange portions 52 and the seal members 54 are brought into contact with each other. Thus, processing spaces S surrounded by the stages 11, the partition wall 13, and the shower heads 40 are formed.

Figure 3:
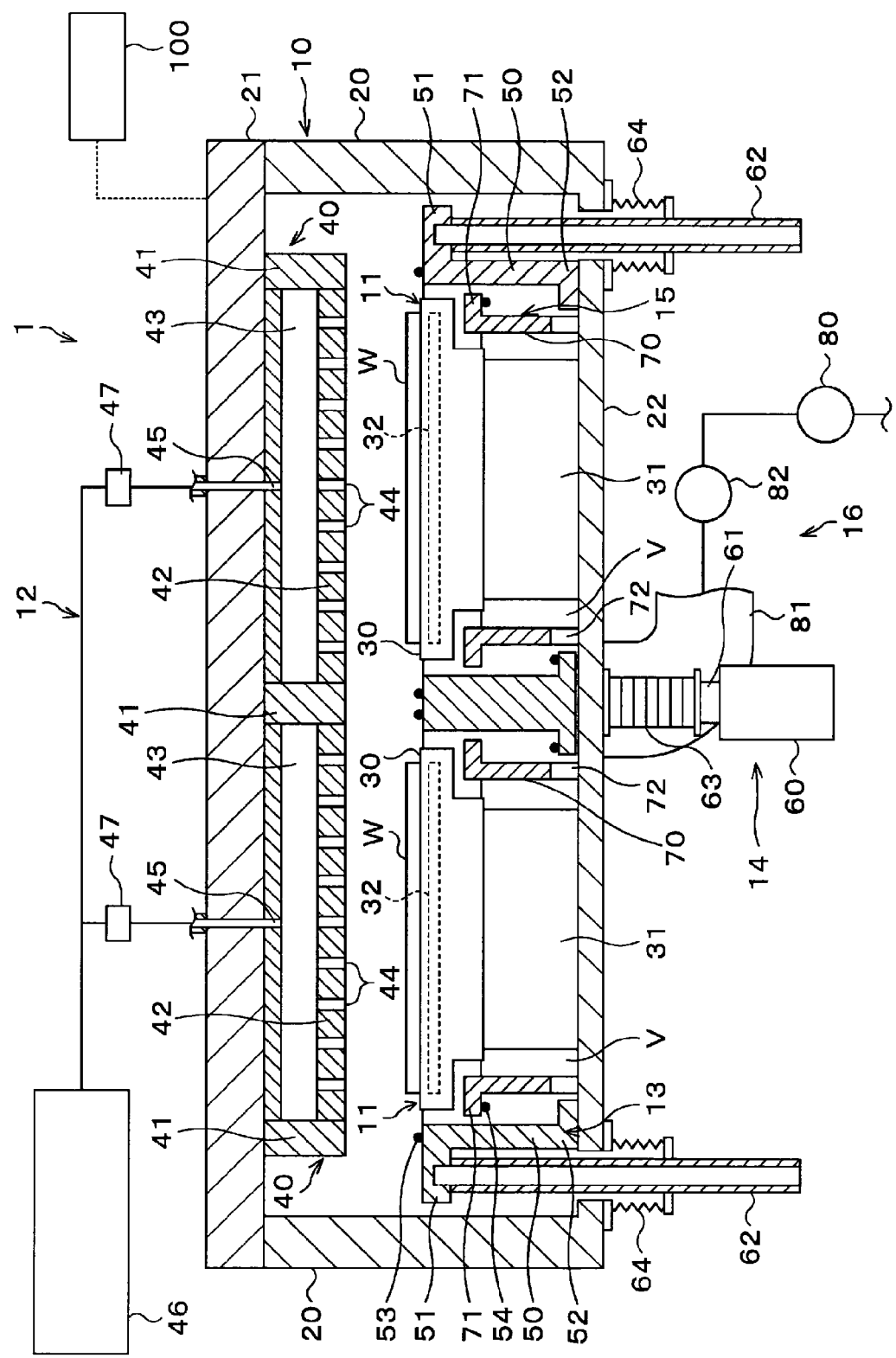
FIG. 3 is a vertical cross-sectional view schematically illustrating a configuration (configuration at a retraction position) of the wafer processing apparatus according to the present embodiment.

As illustrated in FIG. 3, a height of the partition wall 13 is set such that the upper surface of the upper flange portion 51 is positioned, for example, below the upper surfaces of the stages 11 when the partition wall 13 is moved downward by the lifting mechanism 14. This makes it possible to access to the wafers W from the outside of the processing container 10 by moving downward the partition wall 13. A position at which the upper flange portion 51 of the partition wall 13 is in contact with the frame body 41 (at which the processing spaces S are formed) may sometimes be referred to as a "wafer processing position", and a position at which the partition wall 13 is located near the bottom plate 22 or is in contact with the bottom plate 22 may sometimes be referred to as a "retraction position". FIG. 1 illustrates the state in which the partition wall 13 is located at the wafer processing position, and FIG. 3 illustrates the state in which the partition wall 13 is located at the retraction position.

The lifting mechanism 14 configured to move upward and downward the partition wall 13 includes an actuator disposed outside the processing container 10, a drive shaft 61 connected to the actuator 60 and provided to penetrate the bottom plate 22 of the processing container 10 so as to extend in a vertically upward direction inside the processing container 10, and a plurality of guide shafts 62 connected to the partition wall 13 at front ends thereof and extending outward from the processing container 10 at other ends thereof. The guide shafts 62 prevents the partition wall 13 from being tilted when the partition wall 13 is moved upward and downward by the drive shaft 61.

The drive shaft 61 is hermetically connected to a lower end portion of an extendible bellows 63. Am upper end portion of the bellows 63 is hermetically connected to the lower surface of the bottom plate 22. Therefore, when the drive shaft 61 moves upward and downward, the bellows 63 expands and contracts in the vertical direction so that the interior of the processing container 10 is hermetically sealed. In addition, for example, a sleeve (not illustrated) functioning as a guide during the upward-downward operation is provided between the drive shaft 61 and the bellows 63 so as to be fixed to the bottom plate 22.

Each of the guide shafts 62 is connected to an extendible bellows 64 like the drive shaft 61. In addition, an upper end portion of the bellows 64 is hermetically connected over both the bottom plate 22 and the sidewall 20. Therefore, when the guide shafts 62 are moved upward and downward with the upward-downward operation of the partition wall 13 by the drive shaft 61, each bellows 64 extends and contracts in the vertical direction so that the interior of the processing container 10 is hermetically sealed. A sleeve (not illustrated) that functions as a guide during the upward-downward operation is also provided between each guide shaft 62 and each bellows 64 as in the case of the drive shaft 61.

In addition, since the upper end portion of the bellows 64 is a fixed-side end portion, and a lower end portion of the bellows 64 connected to the guide shaft 62 is a free-side end portion. Thus, when an internal pressure of the processing container 10 becomes a negative pressure, a force for compressing the bellows 64 in the vertical direction occurs due to a pressure difference between inside and outside of the bellows 64. Therefore, the guide shaft 62 connected to the free-side end portion of the bellows 64 is raised in the vertically upward direction when the bellows 64 contract. Thus, it is possible to ensure a sealing property between the partition wall 13 and the frame body 41 by moving upward the partition wall 13 in a uniform manner and bringing the seal members 53 and the frame body 41 into appropriate contact with each other. Similarly, it is possible to ensure a sealing property between the partition wall 13 and the protruded portions 71 by bringing the seal members 54 and the protruded portions 71 into appropriate contact with each other. A force tending to push the guide shaft 62 downward acts on the guide shaft 62 due to a reaction force of the bellows 64 serving as an elastic member or the weight of the guide shaft 62. Thus, by appropriately setting the diameter of the bellows 64, the differential pressure acting on the guide shaft 62 is adjusted.

Each of the inner walls 15 is made of a metal such as, for example, aluminum. Each inner wall 15 has a substantially cylindrical main body 70 and a protruded portion 71 provided on an upper end portion of the main body 70 and protruding horizontally toward an outer peripheral direction of the inner wall 15. As illustrated in FIG. 1, the inner walls 15 are disposed so as to individually surround the lower stages 31 of the stages 11, respectively. An inner diameter of the main body 70 of each inner wall 15 is set to be larger than an outer diameter of each lower stage 31. Thus, exhaust spaces V are formed between the inner walls 15 and the lower stages 31. In the present embodiment, the exhaust spaces V also include spaces between the partition wall 13 and the upper stages 30. As illustrated in FIG. 1, a height of the inner walls 15 is set such that the seal members 54 and the protruded portions 71 of the inner walls 15 are brought into contact with each other when the partition wall 13 is raised to the wafer processing position by the lifting mechanism 14. Thus, the inner walls 15 and the partition wall 13 are brought into hermetic contact with each other.

Figure 4A:
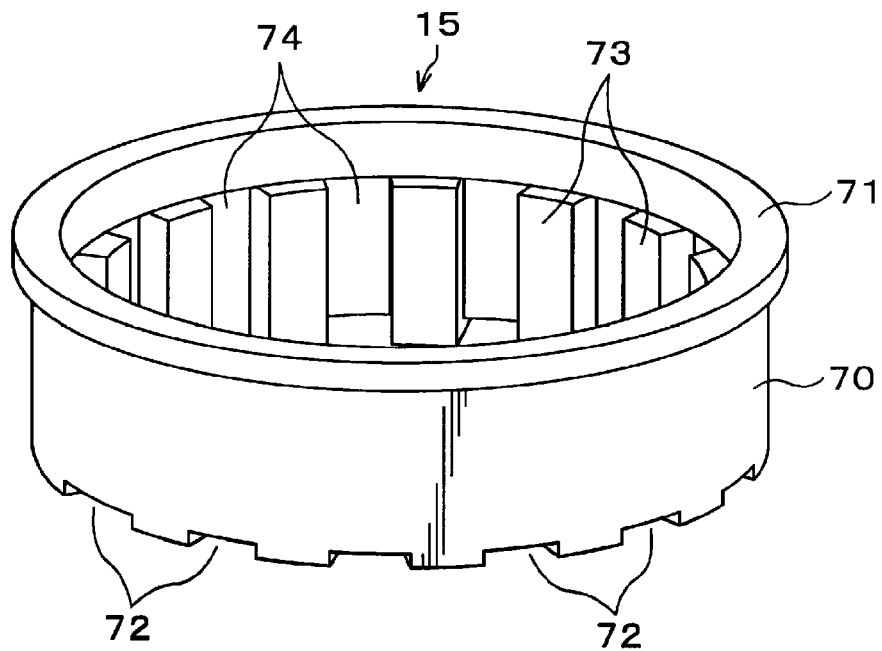
FIGS. 4A and 4B are views schematically illustrating a configuration of an inner wall, FIG. 4A being a perspective view of the inner wall as obliquely viewed from above and FIG. 4B being a perspective view of the inner wall as obliquely viewed from below.
Figure 4B:
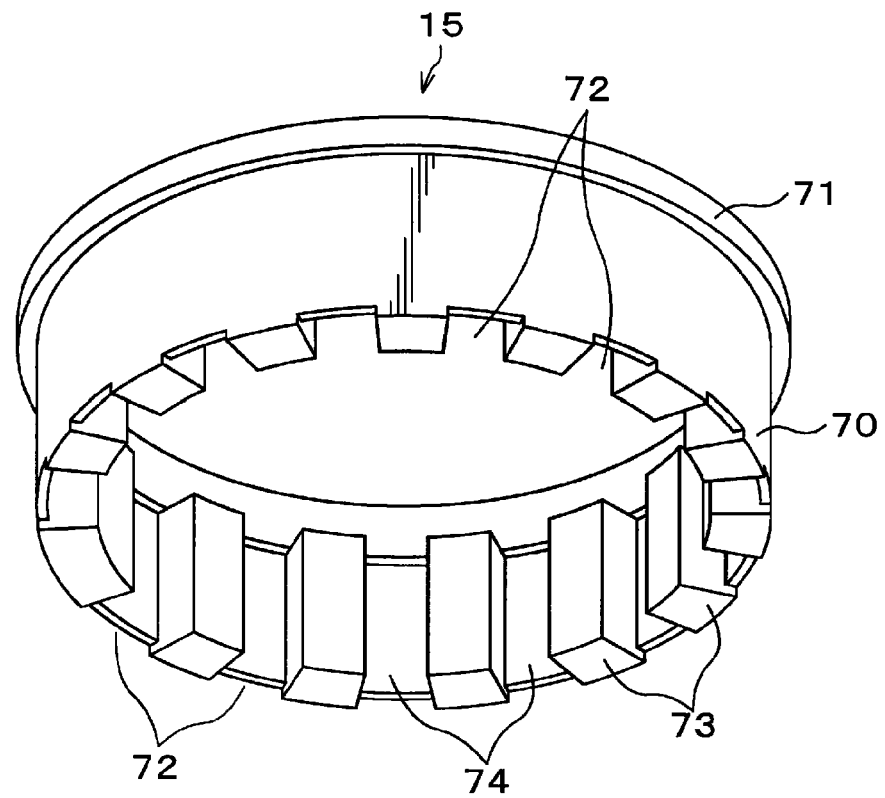

As illustrated in FIG. 4, a plurality of slits 72 are formed in the lower end of the inner wall 15. The slits 72 are exhaust ports through which the processing gas is discharged. In the present embodiment, the slits 72 are formed at, for example, 14 locations at regular intervals in the circumferential direction of the inner wall 15. The positions of the slits 72 may be slightly deviated from the regular intervals due to configuration constraint of the apparatus, but the following description also includes the case in which the positions are slightly deviated from the regular intervals.

A plurality of protruded portions 73 is formed in the inner surface of the inner wall 15 to protrude in an inner circumferential direction of the inner wall 15. Grooves 74 are formed between the respective protruded portions 73 and 73 to extend from the upper end to the lower end of the main body 70. The grooves 74 are in communication with the respective slits 72. In the present embodiment, the grooves 74 are also formed at, for example, 14 locations, at regular intervals along the circumferential direction of the inner wall 15.

The inner wall 15 is fixed to the bottom plate 22 by screwing the protruded portions 73 to the bottom plate 22 of the processing container 10. As described above, the processing container 10 is configured to be heated by a heater (not illustrated). The inner wall 15 is also heated by the heater of the processing container 10. The inner wall 15 is heated to, for example, 100 degrees C. to 150 degrees C. such that the foreign matter contained in the processing gas does not adhere to the inner wall 15.

As illustrated in FIG. 1, the exhaust part 16 has an exhaust mechanism 80 configured to exhaust the interior of the processing container 10. The exhaust mechanism 80 is connected to an exhaust pipe 81 provided outside the inner wall 15 in the bottom plate 22 of the processing container 10. The exhaust mechanism 80 and the exhaust pipe 81 are provided in common to the two inner walls 15 and 15. That is, the processing gas from the two exhaust spaces V and V is exhausted by the exhaust mechanism 80 through the common exhaust pipe 81. The exhaust pipe 81 is provided with a regulation valve 82 configured to regulate an exhaust amount by the exhaust mechanism 80. In addition, the ceiling plate 21 is provided with a pressure measurement mechanism (not illustrated) for measuring an internal pressure of the processing space S of each of the stages 11 and 11. An opening degree of the regulation valve 82 is controlled based on, for example, a measurement value obtained by the pressure measurement mechanism.

The wafer processing apparatus 1 is provided with a controller 100. The controller 100 is, for example, a computer, and has a program storage (not illustrated). The program storage stores a program for controlling the processing of the wafer W in the wafer processing apparatus 1. The program may be stored in a computer-readable storage medium such as, for example, a computer-readable hard disk (HD), a flexible disk (PD), a compact disk (CD), a magneto-optical disk (MO), or a memory card, and may be installed on the controller 100 from the storage medium.

The wafer processing apparatus 1 according to the present embodiment is configured as described above. Next, a wafer processing performed in the wafer processing apparatus 1 will be described.

In the wafer processing, as illustrated in FIG. 3, first, in the state in which the partition wall 13 is lowered to the retraction position, the wafers W are loaded into the processing container 10 by a transfer mechanism (not illustrated) provided outside the wafer processing apparatus 1 and are placed on the respective stages 11.

Thereafter, as illustrated in FIG. 1, the partition wall 13 is raised to the wafer processing position. Thus, the processing spaces S are formed by the partition wall 13.

Then, at a predetermined time, the processing container 10 is exhausted by the exhaust mechanism 80 until the interior thereof is kept at a predetermined pressure, and a processing gas is supplied from the gas source 46 into the processing container 10, so that predetermined process (e.g., the COR process in the present embodiment) is performed on the wafers W.

In the COR process, the processing gas supplied from the gas source 46 is supplied to the wafers W via the shower plates 42. At this time, since the partition wall 13 is provided so as to surround the stages 11, the processing gas supplied from the shower plates 42 are supplied to the wafers W with in-plane uniformity.

Figure 5:
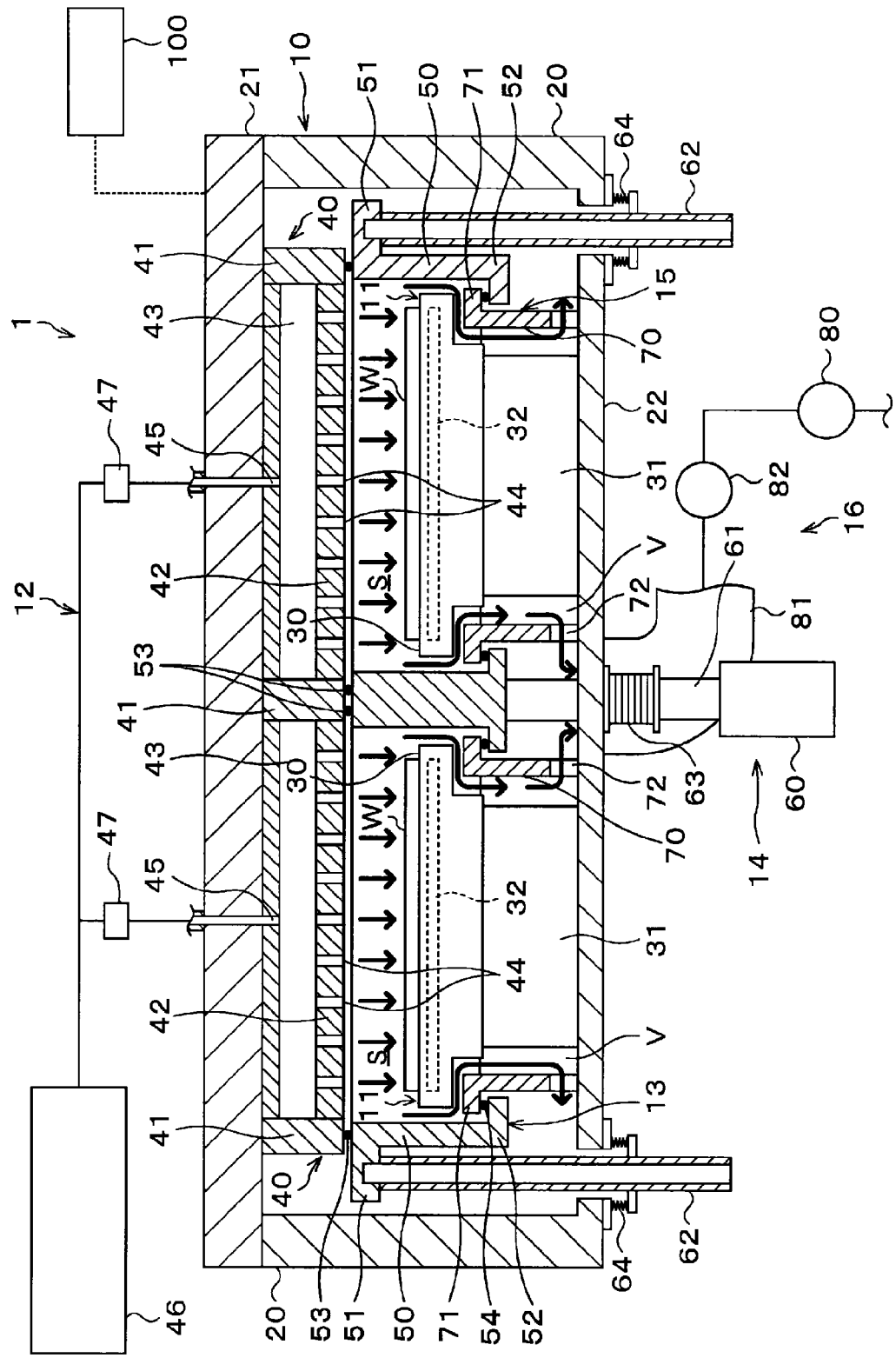
FIG. 5 is an explanatory view illustrating a flow of a processing gas in the wafer processing apparatus.
Figure 6:
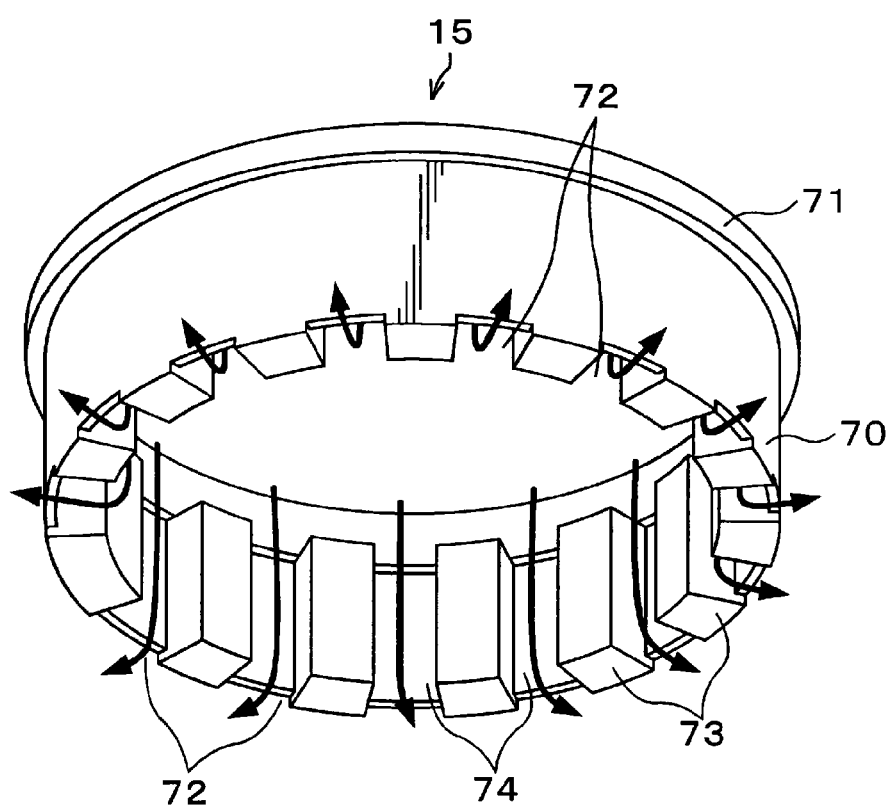
FIG. 6 is an explanatory view illustrating a flow of the processing gas in the inner wall.

As illustrated in FIG. 5, the processing gas in the processing spaces S passes from the outer peripheries of the wafers W placed on the stages 11 through the exhaust spaces V, the slits 72 of the inner wall 15 and the exhaust pipe 81, and is discharged through the discharge pipe 81 by the exhaust mechanism 80. At this time, the processing gas passing through the exhaust spaces V passes through the grooves 74 in the inner wall 15 as illustrated in FIG. 6, so that the processing gas is rectified from above downward, and is discharged from the slits 72. In FIGS. 5 and 6, thick arrows indicate the flow of the processing gas.

Here, in a case where the grooves 74 are not formed in the inner wall 15 as in the related art, a flow velocity of the processing gas discharged through the slits 72 is increased in the slits 72 closer to the exhaust pipe 81 and is reduced in the slits 72 farther away from the exhaust pipe 81. This deviates the flow of the processing gas to the exhaust pipe 81. In this regard, in the present embodiment, since the processing gas is rectified by the grooves 74, the flow of the processing gas to the exhaust pipe 81 is suppressed from deviating. As a result, the processing gas that has passed through the exhaust spaces V is uniformly discharged in the circumferential direction of the inner wall 15.

After the COR process is completed, the partition wall 13 is lowered to the retraction position, and the wafers W on the respective stages 11 are unloaded from the wafer processing apparatus 1 by the wafer transfer mechanism (not illustrated). Thereafter, the wafers W are heated by a heating device provided outside the wafer processing apparatus 1 so that a reaction product generated by the COR process is vaporized and removed. In this manner, a series of wafer processing is completed.

According to the above embodiment, since the partition wall 13 and the inner walls 15 that individually surround the plurality of stages 11 are provided, it is possible to individually form the processing spaces S for the respective stages 11. In addition, since the processing gas in the processing spaces S are exhausted from the slits 72 formed in the inner walls 15, it is possible to ensure the uniformity of the gas flow for each wafer W and to make etched amounts on the wafers W uniform. Thus it is possible to perform in-plane uniform wafer processing.

In addition, since the grooves 74 extending from above downward are formed in the inner surfaces of the inner walls 15, the processing gas is rectified in the exhaust spaces V and uniformly discharged in the circumferential direction from the slits 72 of the inner walls 15. By allowing the processing gas to be uniformly discharged in this way, the processing gas on the wafers W inside the processing spaces S is also made uniform in the planes of the wafers W. In particular, the flow of the processing gas on the outer peripheries of the wafers W is made uniform. This makes it possible to cause the processing gas to remain on the outer peripheries of the wafers W. As a result, it is possible to make an etching rate in the planes of the wafers uniform, thus further improving the in-plane uniformity of wafer processing.

Next, a processing gas discharge method using the inner walls 15 of the present embodiment will be described in more detail.

Figure 7:
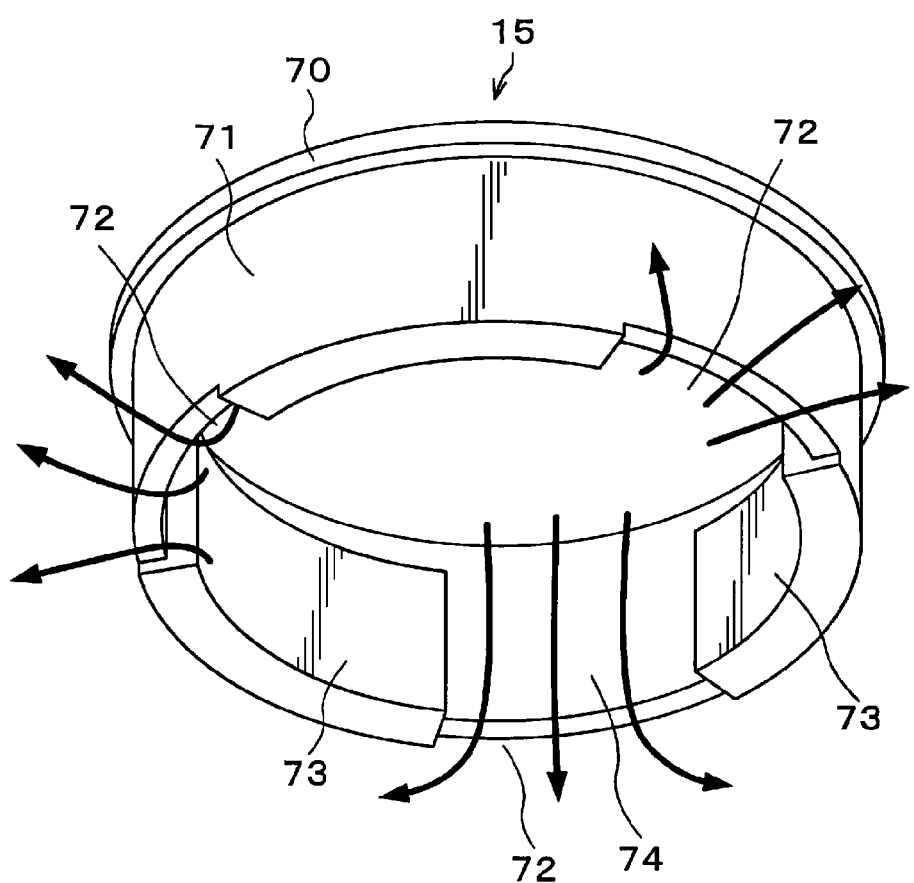
FIG. 7 is an explanatory view illustrating a flow of the processing gas in a case where slits and grooves are respectively formed at three locations in the inner wall.

First, the present inventors examined the number of slits 72 and grooves 74 in the inner wall 15. Specifically, the present inventors examined the flow of processing gas while changing each of the number of slits 72 and the number of grooves 74 to three, six, and fourteen through a simulation. In this simulation, regardless of whether the slits 72 and the grooves 74 are formed at three, six, or fourteen locations, the slits 72 and the grooves 74 were formed at regular intervals in the circumferential direction of the inner wall 15. FIG. 7 illustrates a case in which slits 72 and grooves 74 each are formed at three locations in the inner wall 15. In addition, the case in which the slits 72 and the grooves 74 are formed at 14 locations the inner wall 15 is as illustrated in FIG. 4. The case in which the slits 72 and the grooves 74 are formed at six locations in the inner wall 15 is omitted.

Figure 8:
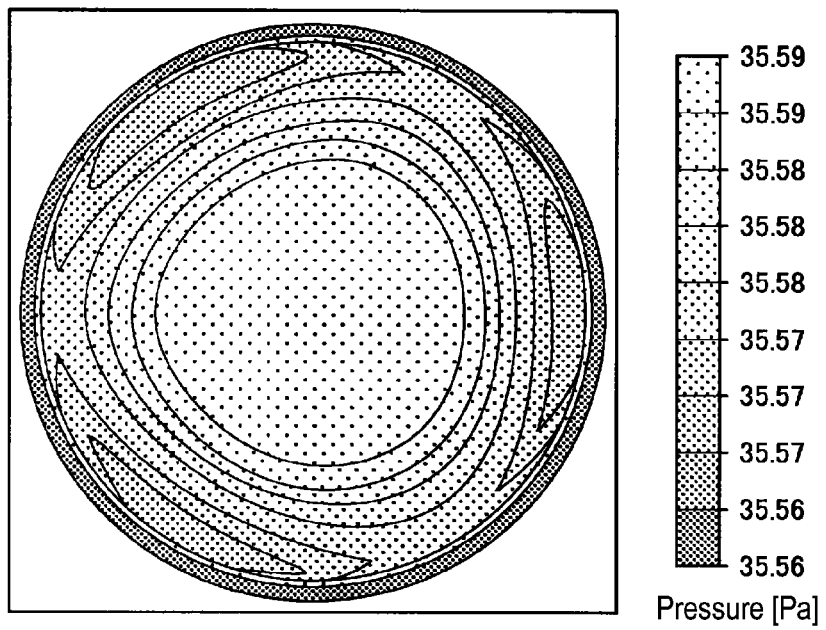
FIG. 8 is an explanatory illustrating a simulation result of pressure distribution when the processing gas is caused to flow in the case where the three slits and the three grooves are formed in the inner wall.

FIG. 8 shows a simulation result of pressure distribution when the processing gas is supplied in the case in which each of the number of the slits 72 and the number of the grooves 74 is three. Specifically, FIG. 8 shows the pressure of the processing gas on the wafer W. Referring to FIG. 8, it can be seen that, in the outer periphery of the inner wall 15, the pressures of the processing gas are different from each other between a portion in which the slit 72 is formed and a portion in which the slit 72 is not formed. That is, the flow velocity of the processing gas is increased in the portion in which the slit 72 is formed rather than in the portion in which the slit 72 is not formed.

Figure 9:
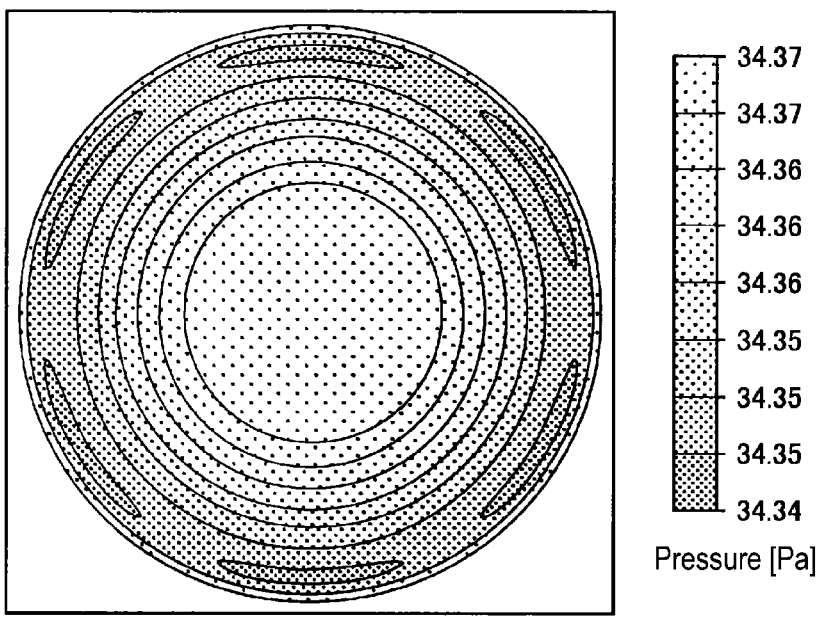
FIG. 9 is an explanatory illustrating a simulation result of pressure distribution when the processing gas is caused to flow in a case where six slits and six grooves are formed in the inner wall.

FIG. 9 shows a simulation result of pressure distribution when the processing gas is supplied when each of the number of the slits 72 and the number of the grooves 74 is six. Referring to FIG. 9, in the outer periphery of the inner wall 15, the pressures of the processing gas are different from each other between a portion in which the slit 72 is formed and a portion in which the slit 72 is not formed. Thus, the flow velocities of the processing gas are different from each other in the portions.

Figure 10:
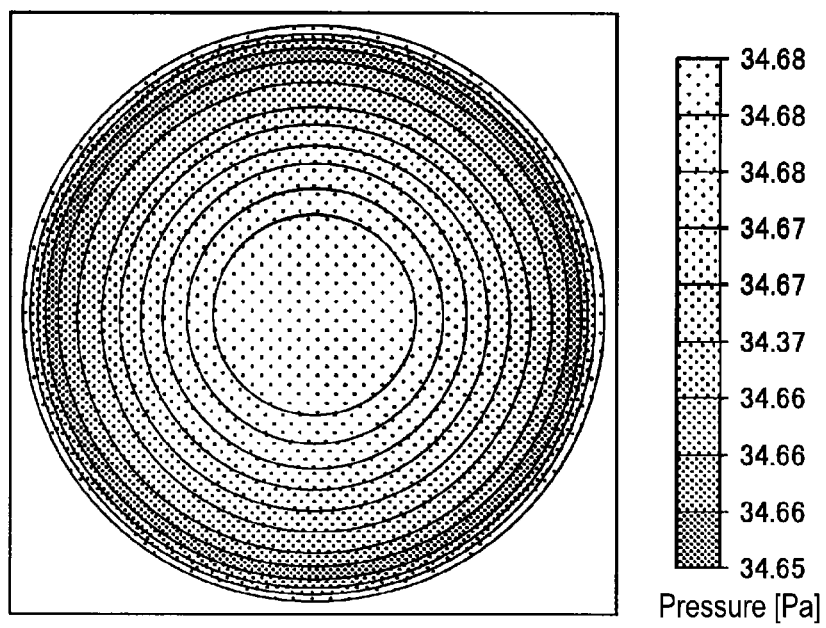
FIG. 10 is an explanatory illustrating a simulation result of pressure distribution when the processing gas is caused to flow in a case where 14 slits and 14 grooves are formed in the inner wall.

FIG. 10 shows a simulation result of pressure distribution when the processing gas is supplied in the case in which each of the number of the slits 72 and the number of the grooves 74 is fourteen. Referring to FIG. 10, in the outer periphery of the inner wall 15, the pressures of the processing gas are substantially the same between a portion in which the slit 72 is formed and a portion in which the slit 72 is not formed. Thus, the flow velocities of the processing gas becomes uniform in the portions.

As a result of the earnest research conducted by the present inventors, it was found that, when each of the number of slits 72 and the number of grooves 74 is seven or more, the pressure distribution of the processing gas in the outer periphery of the inner wall 15 is made uniform as shown in FIG. 10 and thus the flow velocities of the processing gas are made uniform. In such a case, the processing gas is discharged in a more uniform manner Thus, the processing gas remaining on the wafer W in the processing space S is also made uniform in the plane of the wafer W, and thus it is possible to further improve the in-plane uniformity of wafer processing. Accordingly, each of the number of slits 72 and the number of grooves 74 in the inner wall 15 is preferably seven or more.

As a result of the earnest research conducted by the present inventors, it was found that, regardless of whether each of the number of the slits 72 and the number of the grooves 74 is three or six, the pressure distribution of the processing gas in the outer periphery of the inner wall 15 illustrated in FIGS. 8 and 9 becomes non-uniform when the grooves 74 are not formed in the inner wall 15. In other words, even though the pressure distribution of the processing gas becomes somewhat non-uniform regardless of whether each of the number of slits 72 and the number of grooves 74 is three or six, it can be said that when the grooves 74 are formed in the inner wall 15 as in the present embodiment, there is sufficient effect in making the pressure distribution of the processing gas uniform.

Figure 11:
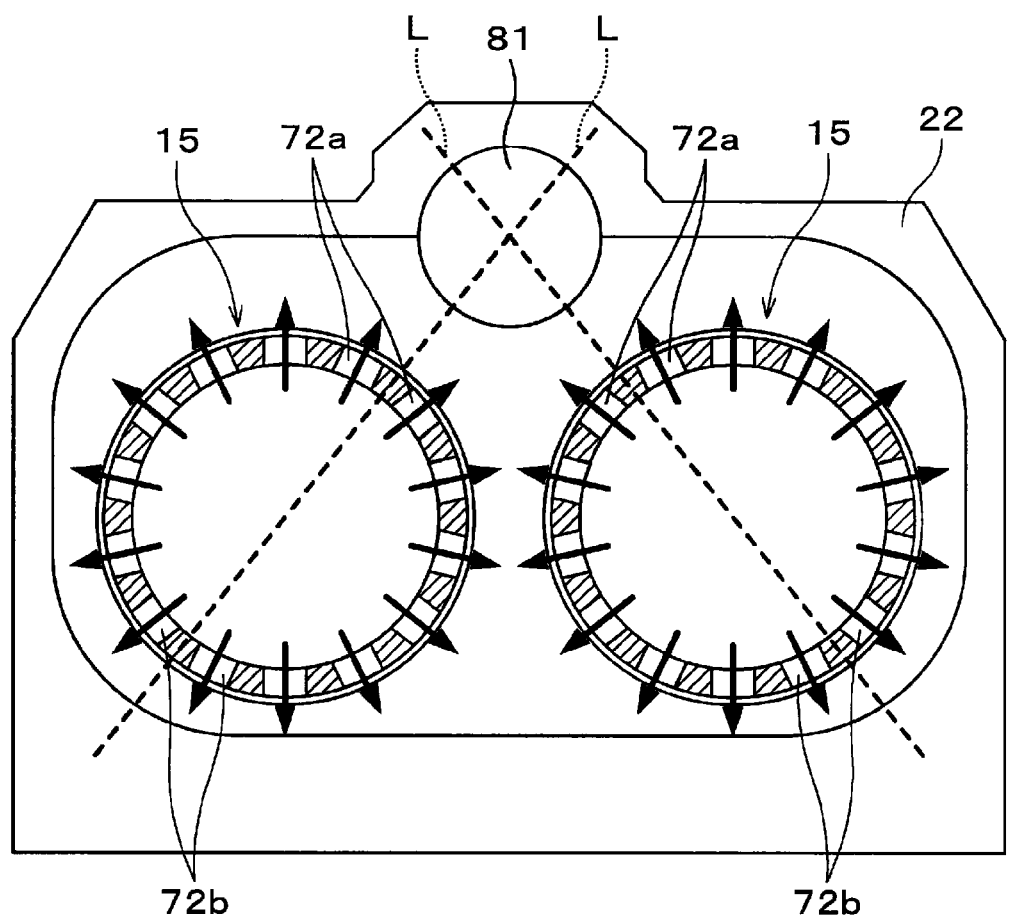
FIG. 11 is an explanatory view illustrating a positional relationship between inner walls and an exhaust pipe.

Next, the arrangement relationship between the inner walls 15 and the exhaust pipe 81 will be described. As illustrated in FIG. 11, the exhaust pipe 81 is disposed outside two inner walls 15 and 15 in the bottom plate 22 of the processing container 10. In the case in which the exhaust pipe 81 is disposed outside the inner walls 15 in this way, when the grooves 74 are not formed in the inner walls 15 as in the related art, the processing gas is strongly pulled at the side close to the exhaust pipe 81 so that the flow velocity of the processing gas is increased, and the processing gas is weakly pulled at the side far from the exhaust pipe 81 so that the flow velocity of the processing gas is reduced. As a result, the pressure distribution of the processing gas on the outer peripheries of the inner walls 15 becomes non-uniform. In contrast, in the present embodiment, even in the case in which the exhaust pipe 81 is disposed outside the inner walls 15, the flow of the processing gas is rectified by the grooves 74 in the inner walls 15, and thus it is possible to make the pressure distribution of the processing gas uniform.

In addition, the slits 72 are arranged to be offset from straight lines L (dotted lines in FIG. 11) connecting the centers of the inner walls 15 and the center of the exhaust pipe 81 in a plan view. In such a case, the paths until the processing gas discharged from the slits 72 flows into the exhaust pipe 81 becomes longer. In a case where the slits 72 are arranged on the straight lines L, the processing gas discharged from the slits 72 is drawn more strongly, so that the flow velocity of the processing gas is increased. In contrast, in the present embodiment, it is possible to reduce the flow velocity of the processing gas discharged from the slits 72, and to cause the processing gas to sufficiently remain on the front surfaces of the wafers W in the processing spaces S. Therefore, it is possible to appropriately perform the COR process using the processing gas.

A distance from the slit 72a located near the exhaust pipe 81 to the exhaust pipe 81 and a distance from the slit 72b located far from the exhaust pipe 81 to the exhaust pipe 81 are different from each other. Therefore, when inner walls 15 in which the grooves 74 are not formed as in the related art are used, the processing gas flowing from the slits 72a to the exhaust pipe 81 is more easily pulled and has a higher flow velocity than the processing gas flowing from the slits 72b to the exhaust pipe 81 since the distance to the exhibit pipe 81 is shorter. In this regard, in the present embodiment, since the processing gas is rectified from above downward by the grooves 74 of the inner walls 15, it is possible to make the flow velocity of the processing gas discharged from the slits 72a and that of the processing gas discharged from the slits 72b substantially the same. Thus, the processing gas is discharged uniformly in the circumferential direction of the inner wall 15.

In some embodiments, the circumferential length of the slit 72b may be set to be larger than that of the slit 72a. In this case, it is possible to increase the flow velocity of the processing gas discharged from the slit 72*b*, and to make the flow velocity of the processing gas to become substantially the same between the slit 72*a* and the slit 72*b*.

Figure 12:
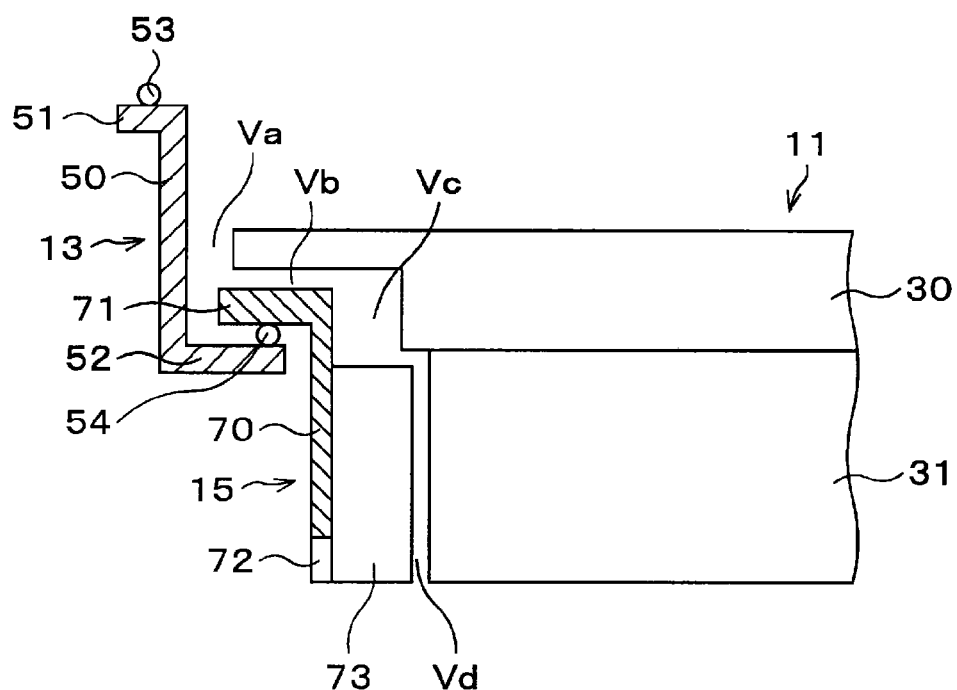
FIG. 12 is an explanatory view illustrating an exhaust space for the processing gas in the vicinity of the inner wall.

Next, the exhaust space V of the processing gas in the vicinity of the inner wall 15 will be described. As illustrated in FIG. 12, the exhaust space V from the outer periphery of the stage 11 to the slit 72 includes an exhaust space Va between the outer periphery of the upper stage 30 and the cylindrical portion 50 of the partition wall 13, an exhaust space Vb between the protruded portion 71 of the inner wall 15 and the bottom surface of the upper stage 30, an exhaust space Vc between the main body 70 of the inner wall 15 and the upper stage 30, and an exhaust space Vd between the protruded portion 73 (the groove 74) of the inner wall 15 and the lower stage 31.

In order to cause the processing gas to remain sufficiently on the wafer W, it is necessary to slow down the flow velocity of the processing gas in the exhaust space V. For this reason, a gap between the exhaust spaces Va and Vb is set to be small. In addition, from the viewpoint of reducing the flow velocity of the processing gas, it is desirable to set a gap between the exhaust spaces Vc and Vd to be small as well. However, in practice, the gap between the exhaust spaces Vc and Vd is set from the viewpoint of improving the exhaust performance, restrictions on the apparatus configuration such as securing a space for screwing the inner wall 15 to the bottom plate 22, the viewpoint of separating cooling of the stage 11 and heating of the inner wall 15, or the like.

In the above-described embodiment, two stages 11 are provided as the plurality of stages, but the number of stages is not limited to the contents of the present embodiment. The plurality of stages means that there are a plurality of placement surfaces. For example, it is understood that the case in which one stage is configured to place a plurality of wafers W thereon also belongs to the scope of the plurality of stages.

In addition, in the above-described embodiment, one partition wall 13 is provided for the plurality of stages 11, but the configuration of the partition wall 13 is not limited to the contents of the present embodiment. The shape of the partition wall 13 may be arbitrarily set as long as an independent processing space S can be formed with respect to each stage 11. For example, a partition wall having only one cylindrical portion 50 may be provided separately for each stage 11.

In the above-described embodiment, the processing spaces S are formed when the partition wall 13 and the frame body 41 come into contact with each other. However, in forming the processing spaces S, a member brought into contact with the partition wall 13 is limited to the frame body 41. For example, the processing spaces S may be formed by bringing the partition wall 13 into contact with the ceiling plate 21.

Although the embodiment of the present disclosure has been described, the present disclosure is not limited thereto. It is evident that a person having ordinary knowledge in the field of technology to which the present disclosure belongs is able to conceive various changes or modifications within the scope of the technical idea described in the claims, and it shall be understood that the changes or modifications naturally belong to the technical scope of the present disclosure. Although the above-described embodiment has been described taking the case in which the COR process is performed on the wafers as an example, the present disclosure is also applicable to other wafer processing apparatuses using a processing gas such as, for example, a plasma processing apparatus.

EXPLANATION OF REFERENCE NUMERALS

1: wafer processing apparatus, 10: processing container, 11: stage, 12: gas supply part, 13: partition wall, 14: lifting mechanism, 15: inner wall, 16: exhaust part, 70: main body, 71: protruded portion, 72: slit, 73: protruded portion, 74: groove, 81: exhaust pipe, 100: controller, W: wafer, S: processing space, V: exhaust space

What is claimed is:

1. A substrate processing apparatus for processing a substrate, comprising:
    a processing container in which a substrate is accommodated;
    a stage configured to place the substrate thereon inside the processing container;
    a showerhead configured to supply a processing gas from above the stage toward the stage;
    an exhaust part configured to exhaust an interior of the processing container;
    a partition wall disposed inside the processing container and surrounding the stage with a gap between the partition wall and an outer periphery of the stage;
    a shaft configured to be driven by an actuator to move upward and downward the partition wall between a retraction position and a substrate processing position; and
    an inner wall disposed on a bottom surface of the processing container and surrounding the stage with a gap between the inner wall and an outer periphery of the stage,
    wherein the inner wall includes:
        a cylindrical main body extending vertically and having an inner surface facing the stage;
        a plurality of protrusions protruding radially inward from the inner surface at intervals in a circumferential direction of the inner wall, and extending vertically from a lower end to an upper end of the inner surface;
        a plurality of grooves, each groove of the plurality of grooves being formed between two adjacent ones of the protrusions; and
        a plurality of slits formed in the lower end of the inner surface at intervals in the circumferential direction of the inner wall, so that the plurality of grooves communicate with the plurality of slits and form a flow path extending downward toward the plurality of slits and outward through the plurality of slits,
    wherein the plurality of slits face the stage surrounded by the inner wall,
    wherein a substrate processing space is formed by the partition wall and the inner wall by moving the partition wall to the substrate processing position,
    wherein the interior of the processing space is exhausted by the exhaust part through the plurality of grooves and the plurality of slits,
    wherein the exhaust part includes an exhaust pipe provided in the bottom surface of the processing container,
    wherein the exhaust pipe is disposed outside the inner wall in a plan view, and
    wherein the plurality of slits are arranged to be offset from a straight line, which connects a center of the inner wall and a center of the exhaust pipe in a plan view.

2. The substrate processing apparatus of claim 1, wherein the plurality of slits and the plurality of grooves are each formed at seven or more locations in the circumferential direction in the inner wall.

3. The substrate processing apparatus of claim 1, wherein the processing gas is rectified by the plurality of grooves while moving downward, and the rectified processing gas is discharged through the plurality of slits.

4. A substrate processing apparatus comprising:
a processing container;
a stage disposed inside the processing container and configured to place a substrate on the stage;
a cylindrical inner wall, which is disposed on a bottom surface of the processing container and surrounds the stage with a gap between the inner wall and an outer periphery of the stage; and
an exhaust pipe provided in the bottom surface of the processing container at a location outside the inner wall in a plan view,
wherein the inner wall includes:
a cylindrical main body extending vertically and having an inner surface facing the stage;
a plurality of protrusions protruding radially inward from the inner surface at intervals in a circumferential direction of the inner wall, and extending vertically from a lower end to an upper end of the inner surface;
a plurality of grooves, each groove of the plurality of grooves being formed between two adjacent ones of the protrusions; and
a plurality of slits formed in the lower end of the inner surface at intervals in the circumferential direction of the inner wall, so that the plurality of grooves communicate with the plurality of slits and form a flow path extending downward toward the plurality of slits and outward through the plurality of slits, wherein the plurality of slits face the stage surrounded by the inner wall, and wherein the plurality of slits are arranged to be offset from a straight line, which connects a center of the inner wall and a center of the exhaust pipe in a plan view.

5. The substrate processing apparatus of claim 4, wherein the plurality of slits and the plurality of grooves are each formed at seven or more locations in the circumferential direction.

6. The substrate processing apparatus of claim 1, wherein a processing gas supplied into the processing container is rectified by the plurality of grooves while moving downward, and the rectified processing gas is discharged through the plurality of slits.

* * * * *